United States Patent
Lee et al.

(10) Patent No.: US 9,433,560 B2
(45) Date of Patent: Sep. 6, 2016

(54) NURSING BOTTLE USING TRANSPARENT FLEXIBLE DISPLAY

(71) Applicant: SAMSUNG DISPLAY CO., LTD., Yongin, Gyeonggi-Do (KR)

(72) Inventors: Ye-Sol Lee, Yongin (KR); Su-Yeon Yun, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 136 days.

(21) Appl. No.: 14/043,131

(22) Filed: Oct. 1, 2013

(65) Prior Publication Data

US 2014/0305897 A1 Oct. 16, 2014

(30) Foreign Application Priority Data

Apr. 16, 2013 (KR) .......................... 10-2013-0041833

(51) Int. Cl.
| | | |
|---|---|---|
| *H01L 51/50* | (2006.01) | |
| *A61J 9/00* | (2006.01) | |
| *A61J 9/02* | (2006.01) | |
| *A47G 19/22* | (2006.01) | |
| *H01L 27/32* | (2006.01) | |

(52) U.S. Cl.
CPC .............. *A61J 9/02* (2013.01); *A47G 19/2227* (2013.01); *H01L 27/3206* (2013.01); *A47G 2019/2238* (2013.01); *A61J 9/005* (2013.01); *H01L 27/326* (2013.01); *H01L 2251/5323* (2013.01); *H01L 2251/5338* (2013.01)

(58) Field of Classification Search
CPC ..... H01L 27/3206–27/3218; A47G 2019/225; A47G 2019/2238; A47G 19/2227

USPC .......................................................... 362/101
See application file for complete search history.

(56) References Cited

U.S. PATENT DOCUMENTS

| | | | |
|---|---|---|---|
| 4,878,588 A | 11/1989 | Ephraim | |
| 5,678,925 A * | 10/1997 | Garmaise et al. | 220/703 |
| 6,213,616 B1 * | 4/2001 | Chien | 362/101 |
| 6,762,734 B2 * | 7/2004 | Blotky et al. | 362/101 |
| 8,123,033 B2 * | 2/2012 | Goldburt | 40/310 |
| 8,830,076 B2 * | 9/2014 | Smith et al. | 340/669 |
| 2003/0122730 A1 * | 7/2003 | Frank et al. | 345/1.1 |
| 2006/0087831 A1 * | 4/2006 | Kramer | 362/101 |
| 2010/0270257 A1 | 10/2010 | Wachman et al. | |
| 2013/0113843 A1 * | 5/2013 | Yamazaki | 313/505 |
| 2013/0271963 A1 * | 10/2013 | Zalon | 362/101 |

FOREIGN PATENT DOCUMENTS

KR    10-2009-0111059 A    10/2009

OTHER PUBLICATIONS

"People who suggest ideas such as OLED baby bottle which can measure a temperature are awarded", http://www.yonhapnews.co.kr/bulletin/2012/11/29/0200000000AKR2012112904340.

Yeseul Lee, "A Baby-Bottle Display that Helps a Baby Bottle Keep Clean and Your Baby Keep Safe", Dept. of livestock business and marketing economics of Konkuk University, http://contest.samsungdisplay.com/prize/prize_2012_view07.html.

\* cited by examiner

*Primary Examiner* — Mariceli Santiago
(74) *Attorney, Agent, or Firm* — Lee & Morse, P.C.

(57) ABSTRACT

A bottle includes a transparent flexible display, and a body, the body being configured to contain a liquid, the body including a display unit that selectively shows the liquid in the body and displays content, and that is deformable by an external force, and a controller that controls the content to be displayed on the display unit.

18 Claims, 5 Drawing Sheets

NURSING BOTTLE USING TRANSPARENT FLEXIBLE DISPLAY

CROSS-REFERENCE TO RELATED APPLICATION

This application claims the benefit of and priority under 35 U.S.C. §119 to Korean Patent Application No. 10-2013-0041833, filed on Apr. 16, 2013, in the Korean Intellectual Property Office, and entitled: "NURSING BOTTLE USING TRANSPARENT FLEXIBLE DISPLAY," which is incorporated by reference herein in its entirety.

BACKGROUND

1. Field

Embodiments relate a nursing bottle using a transparent flexible display.

2. Description of the Related Art

A display device is a device that displays an image signal. The display device may include, e.g., devices such as televisions, computer monitors, personal digital assistants (PDAs), smart devices, or the like that display an image signal from an external source. The display device may be formed of a high definition flat panel-type display module such as an organic light-emitting display panel, a liquid crystal display (LCD) panel, a plasma display panel, or the like.

SUMMARY

Embodiments are directed to a bottle, including a transparent flexible display, and a body, the body being configured to contain a liquid, the body including a display unit that selectively shows the liquid in the body and displays content, and that is deformable by an external force, and a controller that controls the content to be displayed on the display unit.

The bottle may further include a cover configured to attach to the body. The body may have a cylindrical shape.

The controller may be configured to measure a temperature of the liquid in the body, and the display unit may be configured to display the measured temperature.

The controller may have a user input interface, and the controller may receive a content selection input and then transmit a content signal that corresponds to the content select input to the display unit.

The display unit may include a plurality of transparent organic light emitting diodes.

The display unit may include a flexible substrate that is deformable when an external force is applied to the bottle.

The body may include a flexible material that is deformable when the external force is applied to the bottle.

The controller may include an external input terminal.

When an external device is coupled to the external input terminal, the controller may communicate with the external input terminal, obtain and process data of the external device, and then transmit the data to the display unit.

The display unit may be formed as a touch display configured to receive a user input in a capacitive manner or a resistive manner.

The controller may be configured to receive the user input from the display unit, and then transmit an output signal that corresponds to the user input to the display unit.

The output signal that corresponds to the user input may be one of a play mode signal, a sleep mode signal, and a temperature display mode signal.

The output signal that corresponds to the play mode signal may include an image that is received from an external input device by the controller.

The output signal that corresponds to the play mode signal may be changeable due to interaction between the touch display and a user input that is detected by the touch display.

The controller may include a storage unit that stores a basic setting and a user setting of the display unit.

Embodiments are also directed to a display device formed as part of a bottle, the display device including a flexible substrate that deformable when an external force is applied to the bottle, and a plurality of pixels that are formed on the flexible substrate and that have a first region for emission and a second region for transmission of external light, wherein liquid in the bottle is visible via the second region.

The display device may further include a plurality of thin film transistors (TFTs) that are disposed at the first region, a plurality of first electrodes that are disposed at the first region and that are electrically connected with the plurality of TFTs, respectively, a second electrode that faces the plurality of first electrodes and that has a plurality of island-shaped transmission windows corresponding to the second region, and an organic layer that is interposed between the first electrode and the second electrode.

Embodiments are also directed to a method of controlling a transparent flexible display formed as part of a bottle, the method including, by a controller, receiving a content selection signal, by the controller, generating a display control signal in response to the content selection signal, by the controller, transmitting the display control signal to a transparent flexible display device, and displaying content, which corresponds to the display control signal, on the transparent flexible display device.

BRIEF DESCRIPTION OF THE DRAWINGS

Features will become apparent to those of skill in the art by describing in detail example embodiments with reference to the attached drawings in which.

DETAILED DESCRIPTION

Figure 1:
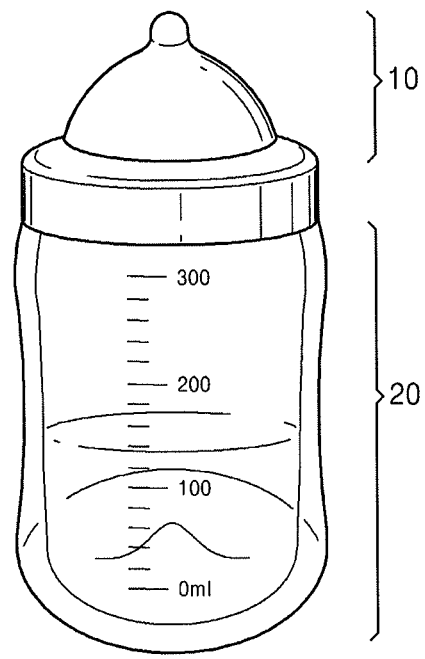
FIG. 1 illustrates a diagram of a general nursing bottle.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items.

FIG. 1 illustrates a diagram of a general nursing bottle.

Referring to FIG. 1, the general nursing bottle includes a body 20 and a cover 10. The body 20 may have a hollow cylindrical shape and may be formed of, e.g., a transparent plastic material or a transparent glass material. Since the body 20 is formed of a transparent material, a user may easily recognize remaining liquid content in the general nursing bottle. The general nursing bottle having the transparent body 20 and formed of the transparent material allows the user to recognize the liquid content in the general nursing bottle.

Figure 2:
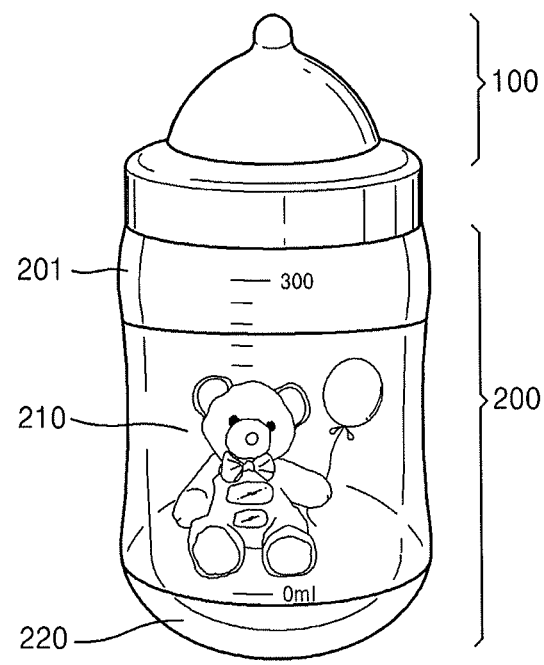
FIG. 2 illustrates a diagram of a nursing bottle having a transparent flexible display applied thereto, according to an example embodiment.

FIG. 2 illustrates a diagram of a nursing bottle having a transparent flexible display applied thereto, according to an example embodiment.

Referring to the example embodiment shown in FIG. 2, the nursing bottle may include a cover 100 and a body 200 including a transparent flexible display.

The cover 100 may include a rubber cap or the like. In the present example embodiment, the cover 100 may correspond to a cover of a general nursing bottle. Thus, the cover 100 may include a rubber cap (not shown) that contacts a mouth of a baby, and a coupling part (not shown) that is coupled or decoupled with the body 200. A shape of the coupling part may vary according to a shape of the body 200 to be described below.

The body 200 may function to contain liquid content of the nursing bottle and may include an outer wall 201 that surrounds a space. The outer wall 201 may be formed of a transparent material so as to allow the liquid content in the body 200 to be visible at the outside of the body 200, and may be deformed when an external force equal to or greater than a predetermined strength is applied thereto. For example, the outer wall 201 of the body 200 may be formed of transparent plastic, and when a user applies a force to the body 200, the body 200 may be partly deformed, and when the force is released, the body 200 may return to its original state.

In the present example embodiment, the outer wall 201 may have a two-layer structure, and a display unit 210 may be formed in a space between two layers of the outer wall 201. In another implementation, the outer wall 201 may have a single-layer structure, and the display unit 210 may be formed at an outer side surface of the outer wall 201. The body 200 may have a shape with a depressed bottom portion. Thus, a central portion of the bottom portion may be spaced apart from a surface on which the body is placed. The central portion may form a space for a controller 220.

The display unit 210 may be one of a cathode ray tube (CRT), an electroluminescent (EL) display, a vacuum fluorescent display, a plasma display panel, a liquid crystal display (LCD) such as a thin-film transistor (TFT) LCD, an organic light-emitting display device, and an electrophoretic display.

The display unit 210 may be a transparent display. The transparent display may be configured to allow the liquid content in the body 200 to be visible at the outside of the body 200, and may display user-desired content. In the present example embodiment, the display unit 210 is a transparent flexible display. The transparent flexible display may be configured to allow the liquid content in the body 200 to be visible at the outside of the body 200, and may display user-desired content. As illustrated in FIG. 2, the display unit 210 may be arranged at a side surface of the outer wall 201 of the body 200. Also, in the present example embodiment, the display unit 210 may receive an external input by detecting a touch by the user, e.g., in a resistive manner or a capacitive manner.

In the present example embodiment, the display unit 210 has transparency. A display having the transparency may be formed as a transparent display device through which a user may view an object, e.g., a liquid content, or an image at an opposite side via the display unit 210. For example, in a case where the display unit 210 is the organic light-emitting display device, the display unit 210 may be formed so that, when the display unit 210 is turned off, the liquid content in the body 200 may be visible through the display unit 210, and when the display unit 210 is turned on, an image that is emitted in the display unit 210 may be visible through the display unit 210. In another implementation, the liquid content may be visible through a space between patterns such as a TFT and various lines, other than an emission region, while the display unit 210 is turned on.

In the present example embodiment, the display unit 210 has flexibility. For example, the display unit 210 may have excellent flexibility and may exhibit a flexible characteristic such that it may be bent due to an external force. In the present example embodiment, the nursing bottle has flexibility and the display unit 210 may be bent together with the outer wall 201 of the body 200. The display unit 210 may be attached to the nursing bottle having the cylindrical shape or may be inserted into the outer wall 201.

In the present example embodiment, the outer wall 201 of the body 200 may include the controller 220 so as to control the display unit 210. The controller 220 may be formed at the depressed bottom portion of the body 200, and may include lines that are connected with the display unit 210. In the example embodiment shown in FIG. 2, the controller 220 is formed at the depressed bottom portion of the body 200. However, in another embodiment, the controller 220 may be arranged at any suitable position of the body 200 that allows the controller 220 to communicate with display unit 210.

In an implementation, the controller 220 may have a thermometer function. The controller 220 may measure a temperature of the liquid content in the body 200 and then may convert a value of the temperature into a digital value to be output via the display unit 210.

Figure 3:
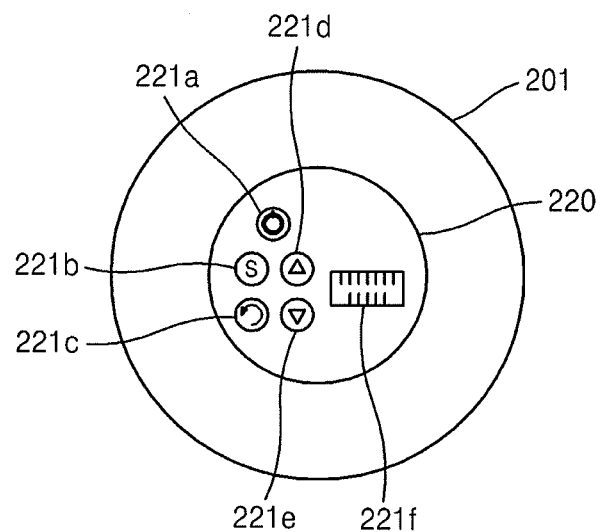
FIG. 3 illustrates a diagram of a shape of a bottom surface of a body, according to an example embodiment.

FIG. 3 illustrates a diagram of a shape of a bottom surface of the body 200, according to an example embodiment.

Viewing the nursing bottle from below as illustrated in FIG. 3, a bottom surface of the body 200 having a cylindrical shape is shown. The controller 220 may be positioned at the bottom surface of the body 200. As described above, the bottom surface of the body 200 may have a depressed shape, and the controller 220 may be positioned at the depressed portion of the bottom surface.

The controller 220 may include one or more buttons for manipulation of the display unit 210. Referring to FIG. 3, the controller 220 may include, e.g., a power button 221a, a selection button 221b, a cancel button 221c, and up and down buttons 221d and 221e. For example, a user may turn on the display unit 210 by using the power button 221a, may select or cancel content by using the selection button 221b or the cancel button 221c, and may adjust a desired input by using the up and down buttons 221d and 221e.

The controller 220 may include an external input terminal 221f. The external input terminal 221f may be, e.g., a universal serial bus (USB) port or a memory reader. The controller 220 may read content of an external device via the external input terminal 221f, may transmit the content to the display unit 210, and then control the display unit 210 such that the content is displayed on the display unit 210.

Figure 4:
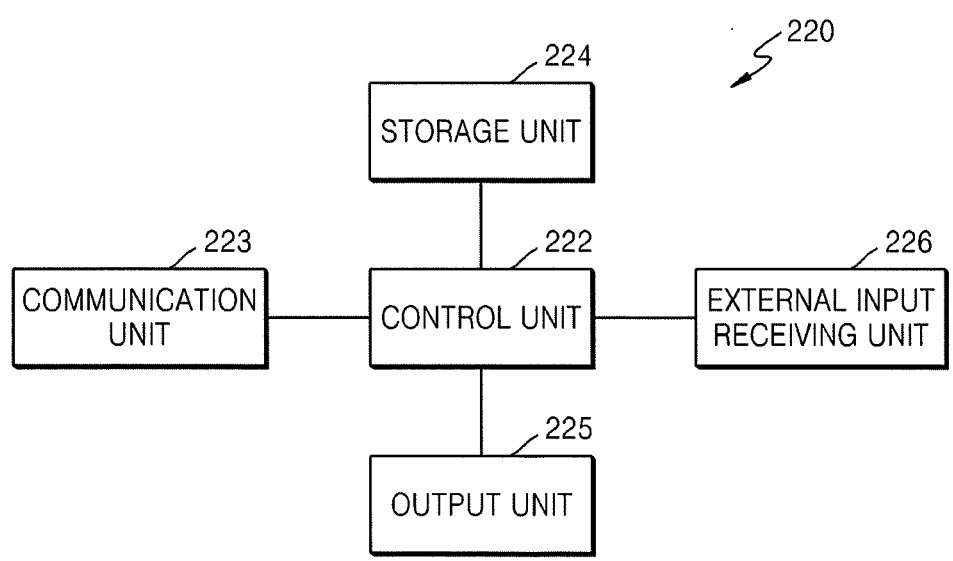
FIG. 4 illustrates a block diagram of an internal structure of a controller, according to an example embodiment.

FIG. 4 illustrates a block diagram of an internal structure of the controller 220, according to an example embodiment.

Referring to the example embodiment shown in FIG. 4, the controller 220 may include a control unit 222, a communication unit 223, a storage unit 224, an output unit 225, and an external input receiving unit 226. The control unit 222 may be a processor or central processing unit (CPU) in the controller 220. The control unit 222 may perform communication between the communication unit 223, the storage unit 224, the output unit 225, and the external input receiving unit 226, and may fetch content from the storage unit 224, may receive an external input and/or a user input, and may output an output image to the display unit 210.

For example, the user may manipulate the buttons 221a through 221e that are arranged at the controller 220, and the communication unit 223 may transmit a result of the manipulation to the control unit 222. Communication between the user and the controller 220 may be performed via the communication unit 223, and the communication unit 223 may convert a specific input by the user into an electric signal and may transmit it to the control unit 222.

The storage unit 224 may store input content, and/or may store a preset internal function and/or a user-input setting. The storage unit 224 may be a part of a memory device included in the controller 220. The output unit 225 may transmit an image to be output to the display unit 210, according to a control by the control unit 222. The output unit 225 may convert the image, which is received from the control unit 222, into an image that matches with specification of the display unit 210.

The external input receiving unit 226 may receive an input from an external input device. As described above, the controller 220 according to the present example embodiment may include a thermometer, the external input terminal 221f, etc. The external input receiving unit 226 may receive a signal and/or data, e.g., from the thermometer, an external input device that is inserted into external input terminal 221f, etc., and then may transmit the signal and/or data to the control unit 222. In an implementation, when the display unit 210 detects a touch by the user, the external input receiving unit 226 may convert the touch into an input signal.

As described above, the controller 220 may output signals to control the display unit 210 via the buttons 221a through 221e and the external input receiving unit 226. The controller 220 may divide the signals to control the display unit 210 into, e.g., a play mode signal, a sleep mode signal, a thermometer mode signal, or the like, and may output the signals.

FIGS. 5A through 5D illustrate display modes of a nursing bottle, according to example embodiments.

Figure 5A:
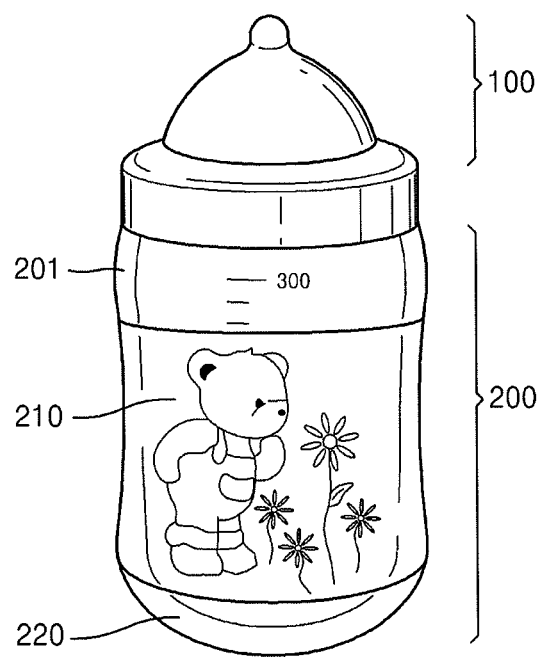
FIGS. 5A through 5D illustrate display modes of a nursing bottle, according to example embodiments.

FIG. 5A illustrates a state of the display unit 210 in the play mode, according to an example embodiment. When a user inputs user-desired content, e.g., via a button of the controller 220 at the play mode, the control unit 222 may control the output unit 225 to fetch content from the storage unit 224 or an external device and then to output a corresponding image to the display unit 210. As illustrated in FIG. 5A, while an image is displayed on the display unit 210, a region of the display unit 210 which does not display the image may remain transparent.

Figure 5B:
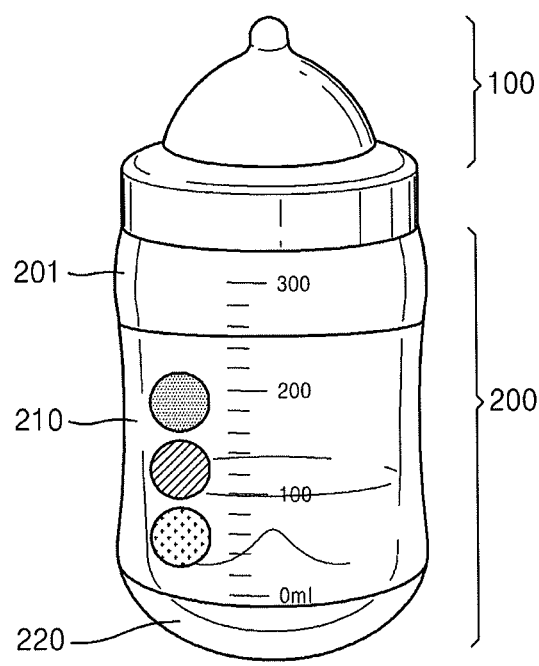

FIG. 5B illustrates a state of the display unit 210 in the play mode, according to another example embodiment. The embodiment of FIG. 5B is related to content having a screen transition effect when a user touches a display screen. In this regard, the display unit 210 may have a touch function, and the user may actively perform interaction with the content.

Figure 5C:
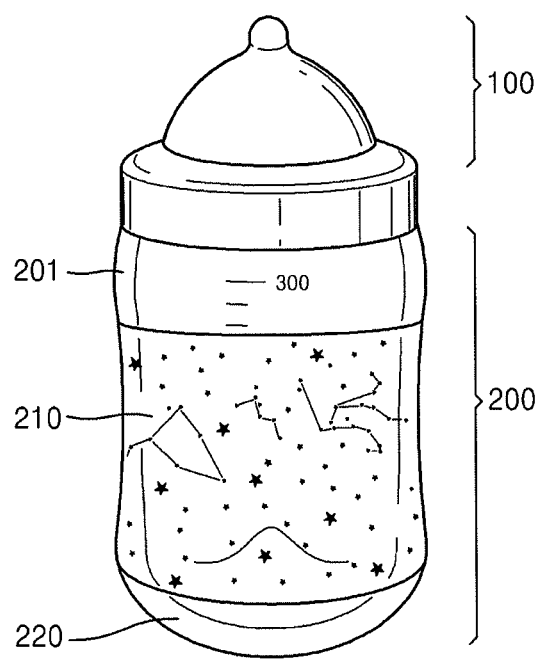

FIG. 5C illustrates a state of the display unit 210 in the sleep mode, according to an example embodiment. In the embodiment of FIG. 5C, when a user selects the sleep mode, an image on the display unit 210 may be changed into a dim image or an image of a night sky, etc.

Figure 5D:
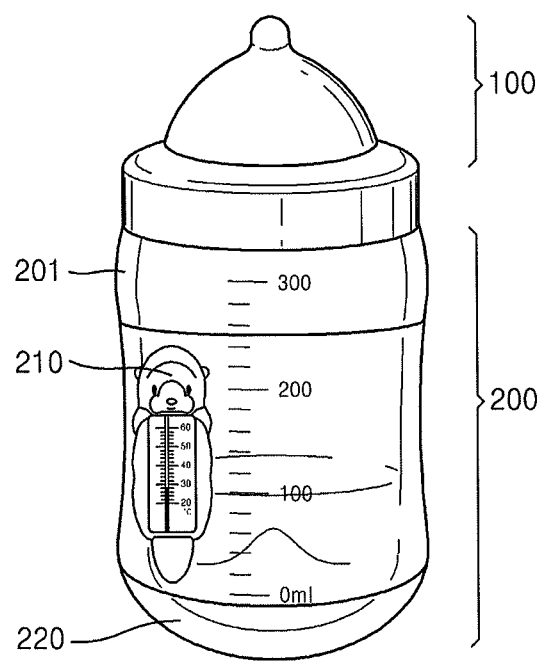

FIG. 5D illustrates a state of the display unit 210 in the thermometer mode, according to an example embodiment. In the embodiment of FIG. 5D, an internal temperature in the body 200 which is measured by the controller 220 may be displayed in the form of a thermometer on the display unit 210.

In the present example embodiment, the display unit 210 may be an organic light-emitting display device. Hereinafter, a detailed structure of the display unit 210 is described for an example embodiment in which the display unit 210 is an organic light-emitting display device having transparency and flexibility.

Figure 6:
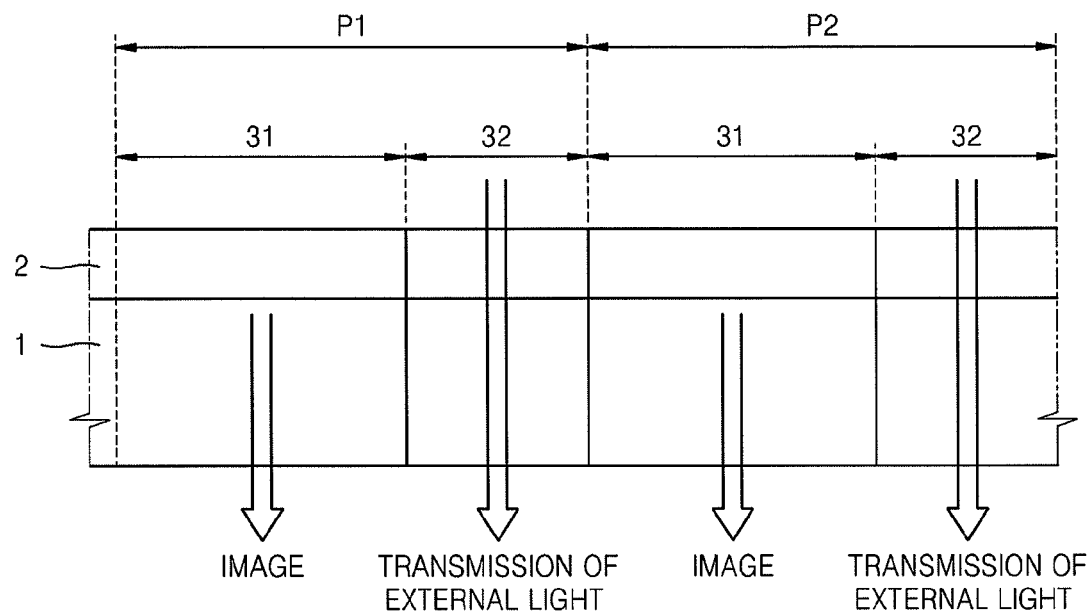
FIG. 6 illustrates a cross-sectional view of a display unit, according to an example embodiment.

FIG. 6 illustrates a cross-sectional view of the display unit 210, according to an example embodiment.

In the example embodiment shown in FIG. 6, the display unit 210 has a structure in which a display portion 2 is arranged on a flexible substrate 1.

The flexible substrate 1 may be formed of a flexible material, e.g., a plastic material such as polyethylene ether phthalate, polyethylene naphthalate (PEN), polycarbonate, polyetherimide, polyether sulfone, polyimide, or the like. The plastic material may be a material that has excellent heat-resistance and durability.

At the display unit 210, which may be an organic light-emitting display device, external light may be incident after passing through the flexible substrate 1 and the display portion 2. As will be described in further detail below, the display portion 2 may transmit the external light. In this regard, referring to FIG. 6, a user at a side where an image is displayed may observe an image at the outside from a top surface of the flexible substrate 1 from the display portion 2. In the example embodiment shown in FIG. 6, the display unit 210 is illustrated as a bottom emission type organic light-emitting display device in which an image of the display portion 2 is realized toward the flexible substrate 1. In another implementation, the display unit 210 may be a top-emission type organic light-emitting display device in which an image is realized away from the flexible substrate 1.

FIG. 6 illustrates a first pixel P1 and a second pixel P2 that are two adjacent pixels of the display unit 210, and each of the first and second pixels P1 and P2 includes a first region 31 and a second region 32. In the present example embodiment, an image is realized on the display portion 2 via the first region 31, and external light passes through the second region 32.

In the present example embodiment, each of the first and second pixels P1 and P2 may include the first region 31 for realization of an image and the second region 32 for transmission of external light. Thus, the user may view an external image, e.g., a content of the bottle, etc., via the second region 32.

For example, by not forming devices such as a thin film transistor (TFT), a capacitor, an organic light emitting diode (OLED), or the like in the second region 32, it may be possible to maximally increase external-light transmittance and to maximally reduce distortion of a transmitted image. For example, the distortion may occur due to interference by the TFT, the capacitor, the OLED, or the like.

In addition, although not illustrated in FIG. 6, a flexible encapsulation substrate, as an encapsulation member, may be arranged on the display portion 2. Also, various protective members as well as the flexible substrate 1 and the flexible encapsulation substrate may be further formed.

Figure 7:
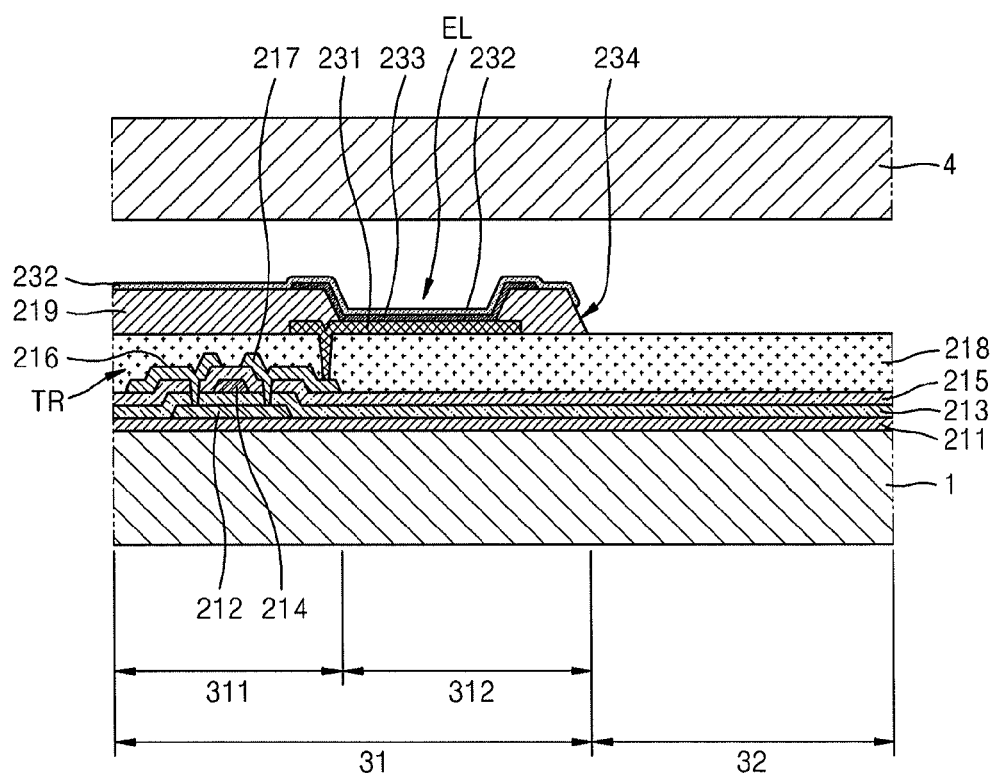
FIG. 7 illustrates a cross-sectional view of the display unit that is the organic light-emitting display device of FIG. 6.

FIG. 7 illustrates a cross-sectional view of the display unit 210 that is the organic light-emitting display device of FIG. 6.

In the example embodiment shown in FIG. 7, a TFT TR is formed at a circuit region 311, but a total number of the TFT TR is not limited to what is shown in FIG. 7, and a pixel circuit including the TFT TR may be formed. The pixel circuit may further include a plurality of TFTs as well as the TFT TR, and a plurality of storage capacitors, and may include lines such as scan lines, data lines, VDD lines, or the like which are connected to the TFTs, the TFT TR, and the storage capacitors.

In the example embodiment shown in FIG. 7, an OLED EL that is an emission device is disposed at an emission region 312. The OLED EL is electrically connected to the TFT TR of the pixel circuit.

A buffer layer 211 may be formed on the flexible substrate 1, and the pixel circuit including the TFT TR may be formed on the buffer layer 211.

A semiconductor active layer 212 may be formed on the buffer layer 211.

The buffer layer 211 may be formed of a transparent insulating material and may function to help prevent penetration of foreign substances and planarize a surface of the flexible substrate 1. The buffer layer 211 may be formed of various materials capable of performing the aforementioned functions. For example, the buffer layer 211 may be formed of an inorganic material such as silicon oxide, silicon nitride, silicon oxynitride, aluminum oxide, aluminum nitride, titanium oxide, or titanium nitride, or an organic material such as polyimide, polyester, acryl, or the like, or may be formed as a multi-layer stack including the inorganic material and the organic material.

The semiconductor active layer 212 may be formed of, e.g., polycrystalline silicon, and may be formed as an oxide semiconductor. For example, the semiconductor active layer 212 may be a G-I—Z—O layer [$(In_2O_3)_a(Ga_2O_3)_b(ZnO)_c$ layer] (where, a, b, c are real numbers that satisfy a≥0, b≥0, c>0, respectively). When the semiconductor active layer 212 is formed as the oxide semiconductor, light-transmittance at the circuit region 311 of the first region 31 may be further increased, so that light-transmittance for external light at an entire portion of the display portion 2 may be increased.

A gate insulating layer 213 may be formed on the buffer layer 211 so as to cover the semiconductor active layer 212, and a gate electrode 214 may be formed on the gate insulating layer 213.

An interlayer insulating layer 215 may be formed on the gate insulating layer 213 so as to cover the gate electrode 214, and a source electrode 216 and a drain electrode 217 may be formed on the interlayer insulating layer 215 so that the source electrode 216 and the drain electrode 217 contact the semiconductor active layer 212 via contact holes, respectively.

A passivation layer 218 may be formed to cover the TFT TR. The passivation layer 218 may be formed as single or multiple insulating layers, and a top surface may be planarized. The passivation layer 218 may be formed of, e.g., an inorganic material and/or an organic material.

As illustrated in FIG. 4, a first electrode 231 of the OLED EL that is electrically connected with the TFT TR may be formed on the passivation layer 218. The first electrode 231 may have an island form that is separate in each pixel.

An insulating layer 219, e.g., an organic insulating material and/or an inorganic insulating material, may be formed on the passivation layer 218. The insulating layer 219 may cover side portions of the first electrode 231 and expose a central portion of the first electrode 231. The insulating layer 219 may be disposed in the first region 31, e.g., the insulating layer 219 may partially cover the first region 31, e.g., the side portions of the first electrode 231.

An organic layer 233 and a second electrode 232 may be sequentially stacked on the first electrode 231. The second electrode 232 may cover the organic layer 233 and the insulating layer 219, and may be electrically connected with all pixels, e.g., may be a common electrode.

The organic layer 233 may be formed as, e.g., a small-molecule organic layer or a polymer organic layer. When the organic layer 233 is formed as the small-molecule organic layer, the organic layer 233 may have a structure in which a hole injection layer (HIL), a hole transport layer (HTL), an emission layer (EML), an electron transport layer (ETL), an electron injection layer (EIL) or the like are singularly or multiply stacked, and may be formed by using one of various organic materials including copper phthalocyanine (CuPc), N,N'-di(naphthalene-1-yl)-N,N'-diphenyl-benzidine (NPB), tris-8-hydroxyquinoline aluminum) (Alq3), or the like. The small-molecule organic layer may be formed by using a vacuum deposition method. The HIL, the HTL, the ETL, and the EIL may be common layers and thus may be commonly applied to red, green, and blue pixels.

The first electrode 231 may function as an anode electrode, and the second electrode 232 may function as a cathode electrode. In another implementation, the polarity of the first electrode 231 and the second electrode 232 may be switched.

In the present example embodiment, the first electrode 231 may be a transparent electrode, and the second electrode 232 may be a reflective electrode. The first electrode 231 may be formed of, e.g., ITO, IZO, ZnO, or $In_2O_3$ which has a high work function. The second electrode 232 may be formed of metal such as Ag, Mg, Al, Pt, Pd, Au, Ni, Nd, Ir, Cr, Li, or Ca which has a low work function. In an example embodiment, the organic light-emitting display device may be a bottom emission-type organic light-emitting display device in which an image is realized toward the first electrode 231. In another example embodiment, the second electrode 232 may also be formed as a transparent electrode.

The passivation layer 218, the gate insulating layer 213, the interlayer insulating layer 215, and the insulating layer 219 may be formed as transparent insulating layers.

A flexible encapsulation substrate 4 may be formed on the second electrode 232. The flexible encapsulation substrate 4 may be externally bonded with the flexible substrate 1 by using a separate sealant (not shown), so that the flexible encapsulation substrate 4 may encapsulate the display portion 2 against outside air. A separate filling material (not shown) may fill a space between the flexible encapsulation substrate 4 and the second electrode 232, and an absorbent may be interposed there between. The flexible encapsulation substrate 4 may be formed of the same material as the flexible substrate 1 and may have a multi-inorganic layer structure or a structure including an inorganic layer and an organic layer. In another implementation, the encapsulation structure for the display portion 2 may use a film-type encapsulation structure.

In the present example embodiment, a transmission window 234 may be further formed at the second electrode 232 and the insulating layer 219. The transmission window 234 may be formed only at the second electrode 232, and may be further formed at one of the passivation layer 218, the interlayer insulating layer 215, the gate insulating layer 213, and the buffer layer 211. The transmission window may enable greater light transmission in the second region 32.

According to the one or more embodiments, a display that displays user-desired content or preset content on the body of the nursing bottle may be provided as part of the nursing bottle. The display may have transparency and flexibility so that the display may be bent due to an external force.

The particular implementations shown and described herein are illustrative examples and are not intended to otherwise limit the scope of the embodiments in any way. For the sake of brevity, general electronics, control systems, software development and other functional aspects of the systems (and components of the individual operating components of the systems) may not be described in detail. Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical."

The use of the terms "a" and "an" and "the" and similar referents in the context of describing the embodiments (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or example language (e.g., "such as") provided herein, is intended merely to better illuminate the embodiments and does not pose a limitation on the scope of the embodiments unless otherwise claimed. Numerous modifications and adaptations will be readily apparent to those skilled in this art without departing from the spirit and scope.

By way of summation and review, a transparent display device and a flexible display device are being developed. A nursing bottle may be formed of a body that contains liquid content and a cover that contacts a mouth of a user. In this regard, in general, the body of the nursing bottle may be formed of a transparent material so as to show the liquid content inside the body of the bottle.

As described above, embodiments relate to a nursing bottle that has a transparent flexible display applied to its body and that displays preset or user-set content on the transparent flexible display. Embodiments may provide a nursing bottle having a body that includes a display for displaying user-desired content or preset content, wherein the display has transparency and flexibility so as to be bent due to an external force.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A bottle, comprising:
a transparent flexible display; and
a body, the body being configured to contain a liquid, the body including:
  a display unit that selectively shows the liquid in the body and displays content, and that is deformable by an external force; and
  a controller that controls the content to be displayed on the display unit,
wherein when the external force is released, the display unit returns to its original state.

2. The bottle as claimed in claim 1, further comprising a cover configured to attach to the body, and wherein the body has a cylindrical shape.

3. The bottle as claimed in claim 1, wherein:
the controller is configured to measure a temperature of the liquid in the body, and
the display unit is configured to display the measured temperature.

4. The bottle as claimed in claim 1, wherein:
the controller has a user input interface, and
the controller receives a content selection input and then transmits a content signal that corresponds to the content select input to the display unit.

5. The bottle as claimed in claim 1, wherein the display unit includes a plurality of transparent organic light emitting diodes.

6. The bottle as claimed in claim 1, wherein the display unit includes a flexible substrate that is deformable when an external force is applied to the bottle.

7. The bottle as claimed in claim 6, wherein the body includes a flexible material that is deformable when the external force is applied to the bottle.

8. The bottle as claimed in claim 1, wherein the controller includes an external input terminal.

9. The bottle as claimed in claim 8, wherein, when an external device is coupled to the external input terminal, the controller communicates with the external input terminal, obtains and processes data of the external device, and then transmits the data to the display unit.

10. The bottle as claimed in claim 1, wherein the display unit is formed as a touch display configured to receive a user input in a capacitive manner or a resistive manner.

11. The bottle as claimed in claim 10, wherein the controller is configured to receive the user input from the display unit, and then transmit an output signal that corresponds to the user input to the display unit.

12. The bottle as claimed in claim 11, wherein the output signal that corresponds to the user input is one of a play mode signal, a sleep mode signal, and a temperature display mode signal.

13. The bottle as claimed in claim 12, wherein the output signal that corresponds to the play mode signal includes an image that is received from an external input device by the controller.

14. The bottle as claimed in claim 12, wherein the output signal that corresponds to the play mode signal is changeable due to interaction between the touch display and a user input that is detected by the touch display.

15. The bottle as claimed in claim 1, wherein the controller includes a storage unit that stores a basic setting and a user setting of the display unit.

16. A display device formed as part of a bottle, the display device comprising:

a flexible substrate that is deformable when an external force is applied to the bottle; and a plurality of pixels that are formed on the flexible substrate and that have a first region for emission and a second region for transmission of external light, wherein liquid in the bottle is visible via the second region, wherein when the external force is released, the flexible substrate returns to its original state.

17. The display device as claimed in claim 16, further comprising:

a plurality of thin film transistors (TFTs) that are disposed at the first region;

a plurality of first electrodes that are disposed at the first region and that are electrically connected with the plurality of TFTs, respectively;

a second electrode that faces the plurality of first electrodes and that has a plurality of island-shaped transmission windows corresponding to the second region; and an organic layer that is interposed between the first electrode and the second electrode.

18. A method of controlling a transparent flexible display formed as part of a bottle, the method comprising:

by a controller, receiving a content selection signal;

by the controller, generating a display control signal in response to the content selection signal;

by the controller, transmitting the display control signal to a transparent flexible display device; and displaying content, which corresponds to the display control signal, on the transparent flexible display device, the transparent flexible display device being deformable when an external force is applied to the transparent flexible display device, wherein when the external force is released, the transparent flexible display device returns to its original state.

* * * * *